(12) United States Patent
Satoh

(10) Patent No.: US 6,300,232 B1
(45) Date of Patent: Oct. 9, 2001

(54) SEMICONDUCTOR DEVICE HAVING PROTECTIVE FILMS SURROUNDING A FUSE AND METHOD OF MANUFACTURING THEREOF

(75) Inventor: Kenji Satoh, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/548,149

(22) Filed: Apr. 13, 2000

(30) Foreign Application Priority Data

Apr. 16, 1999 (JP) .................................................. 11-108766

(51) Int. Cl.⁷ ..................................................... H01L 21/44
(52) U.S. Cl. ............................ 438/601; 438/362; 257/529
(58) Field of Search .................................... 438/362, 601, 438/625, 653, 738, 132, 281, 467; 257/415, 432, 529, 534, 640, 665, 209, 211

(56) References Cited

U.S. PATENT DOCUMENTS

| | | | |
|---|---|---|---|
| 5,729,041 | * | 3/1998 | Yoo et al. .............................. 257/529 |
| 6,060,756 | * | 5/2000 | Machida et al. ...................... 257/415 |
| 6,204,548 | * | 3/2001 | Komai .................................. 257/529 |

FOREIGN PATENT DOCUMENTS

| | | |
|---|---|---|
| 57-75442 | 5/1982 | (JP) . |
| 8-46048 | 2/1996 | (JP) . |

\* cited by examiner

*Primary Examiner*—David Nelms
*Assistant Examiner*—Phuc T. Dang

(57) ABSTRACT

The present invention discloses a semiconductor device and its manufacture by which damages, such as cracks, generated by the heat of melting of a fuse that is employed for isolating a circuit from the other circuits, can be blocked from propagating into other parts of the semiconductor device. A lower protective film formed on an oxide film provided on a substrate, has a width larger than that of the fuse, and blocks the propagation of damages generated at melting of the fuse. A first insulating film formed on the oxide film so as to cover the lower protective film, has two grooves reaching the lower protective film that is formed so as to surround the fuse. The fuse is formed in the region between the two grooves formed in the first insulating film. A second insulating film is formed on the first insulating film so as to cover the fuse, and has grooves connected to the grooves formed in the first insulating film. A side-face protective film is formed within the grooves formed in the first and second insulating films and blocks the propagation of damages generated at melting of the fuse.

19 Claims, 6 Drawing Sheets

- 15 FUSE
- 13 LOWER PROTECTIVE FILM
- 17 SIDE-FACE PROTECTIVE FILM
- 18a APERTURE

- APERTURE 18a
- 15 FUSE
- 18 APERTURE FILM
- 16 SECOND INSULATING FILM
- 14 FIRST INSULATING FILM
- 12 OXIDE FILM
- 11 SUBSTRATE
- 13 LOWER PROTECTIVE FILM

104 DUMMY PATTERN
103 FUSE

FUSE
104 DUMMY PATTERN
102 OXIDE FILM
101 SUBSTRATE

SEMICONDUCTOR DEVICE HAVING PROTECTIVE FILMS SURROUNDING A FUSE AND METHOD OF MANUFACTURING THEREOF

BACKGROUND OF THE INVENTION

1. Field of the Invention

The present invention relates to a semiconductor device equipped with a fuse for isolating a circuit from the other circuits, and a method of manufacturing the device. And the present invention relates more particularly to a semiconductor device capable of suppressing damages that may be generated at melting of the fuse to a minimum level, and a method of manufacturing the device.

2. Description of the Related Art

In order to remove a defective circuit from a semiconductor device equipped with a redundant circuit, a fuse connected to the defective circuit is melted with, for example, a laser beam. In melting the fuse through irradiation of a laser beam, there occurs sometimes a case in which damages (such as cracks) are generated due to the heat of the laser in an insulating film in the peripheral region of the fuse.

If cracks are developed in the film, infiltration of water, for example, from the outside becomes easy, resulting in a deterioration in the moisture resistance. Because of this, circuits and wirings are formed normally removed from the fuse as much as possible in order to avoid the effect of the cracks on them. More specifically, the circuits and the wirings are formed by, for example, about 100 and 10 $\mu$m, respectively, removed from the fuse. However, formation of the circuits and wirings away from the fuse results in an increase in wasteful regions, deteriorating the degree of integration of the circuit.

Techniques for suppressing the propagation of cracks to the periphery of the fuse have been disclosed, for example, in Japanese Patent Application Laid Open No. Sho 57-75442 and Japanese Patent Application Laid Open No. Hei 8-46048.

According to the technique disclosed in Japanese Patent Application Laid Open No. Sho 57-75442, a polycrystalline silicon protective film connected to a substrate is formed directly below the fuse via an insulating film. By so doing, the heat generated at melting of the fuse is discharged to the outside through the semiconductor substrate to suppress the generation of the cracks.

According to the technique disclosed in Japanese Patent Application Laid Open No. Hei 8-46048, as shown in FIG. 6, after the formation of a fuse 103 in an oxide film 102 on a substrate 101, a dummy film is formed on the oxide film 102. After patterning the dummy film a dummy pattern 104 is formed in the periphery of the fuse 103. In this way, cracks or the like generated at fuse melting is prevented from propagating into the region adjacent to the fuse.

However, the above techniques have the following problems.

In the technique disclosed in Japanese Patent Application Laid Open No. Sho 57-75442, an insulating film is disposed between the fuse and the protective film, so that damages (cracks or the like) may be developed before the heat of laser irradiating the fuse is transmitted to the protective film. This technique has therefore a problem in that it cannot prevent propagation of cracks generated in the insulating film into the regions adjacent to the fuse.

In the technique disclosed in Japanese Patent Application Laid Open No. Hei 8-46048, since the dummy pattern 104 is formed out of one sheet of film, cracks generated at melting of the fuse may propagate into the periphery of the fuse from the upper or lower part of the dummy pattern 104. This technique has an additional problem in that cracks generated in the film of the dummy pattern propagate toward the substrate 101 since the dummy pattern 104 is formed only around the fuse 103.

SUMMARY OF THE INVENTION

It is therefore an object of the present invention to provide a semiconductor device which is capable of enhancing the degree of integration of the circuit. Moreover, it is another object of the present invention to provide a method of manufacturing a semiconductor device that is capable of enhancing the operational reliability of a semiconductor device. Furthermore, it is another object of the present invention to provide a semiconductor device that is capable of suppressing the damages to the device generated at melting of the fuse to a minimum level, and a method of manufacture of the same.

In order to attain the above objects, a semiconductor device according to a first viewpoint of this invention is a semiconductor device equipped with a fuse for isolating a circuit from the other circuits, which comprises, a lower protective film, having a width larger than that of a fuse, formed in a prescribed region on a substrate to block the propagation of damages caused by the heat (fuse melting heat) generated at melting of the fuse, a fuse formed on the lower protective film, an insulating film formed on the lower protective film so as to cover the fuse, reaching the lower protective film to enclose the fuse, and a side-face protective film formed in a groove of the insulating film for blocking the propagation of damages caused by the heat of melting of the fuse.

According to this invention, it is possible to prevent the propagation of the damages caused by the heat generated at melting of the fuse into the periphery of the fuse, by means of the lower protective film and the side-face protective film. Moreover, since the side-face protective film is formed in a groove reaching the lower protective film, there is no gap between the side-face protective film and the lower protective film. With this arrangement, it is possible to prevent the propagation of the damages generated at melting of the fuse into the periphery of the fuse through the gap between the side-face protective film and the lower protective film. Accordingly, it becomes possible to form circuits, wirings, and the like in the region directly below or in the periphery of the fuse, which enhances the degree of integration as well as the operational reliability of the semiconductor device.

The groove formed so as to surround the fuse may be constituted of two grooves facing with each other with the fuse in between, and the side-face protective film may be formed in the two grooves.

The groove may be composed of a single closed groove surrounding the fuse, and the side-face protective film may be formed in the single closed groove.

The side-face protective film may be composed of a lower side-face protective film and an upper side-face protective film formed on the lower side-face protective film, and the lower side-face protective film maybe made of the same material as that of the fuse.

The lower side-face protective film may be formed such that its connecting plane to the upper side-face protective film is substantially on the same horizontal plane as the surface of the fuse.

The side-face protective film may be formed in a plural number.

By so doing, it is possible to prevent such a large damage that cannot be prevented by a single sheet of side-face protective film.

The lower side-face protective film may be formed of a material that is less vulnerable to the generation of cracks caused by the heat of melting of the fuse.

The lower side-face protective film may be formed in a plural number.

By so doing, it is possible to prevent such a large damage that cannot be prevented by a single sheet of the lower side-face protective film.

A method of manufacturing a semiconductor device according to a second viewpoint of this invention is a method of manufacturing a semiconductor device equipped with a fuse for isolating a circuit from the other circuits comprising, a step of forming in a prescribed region of a substrate a lower protective film, having a width larger than that of the fuse, which blocks the propagation of damages caused by the heat (fuse melting heat) generated at melting of the fuse, a step of forming a fuse on the lower protective film, a step of forming an insulating film on the lower protective film so as to cover the fuse, a step of forming a groove reaching the lower protective film in the insulating film so as to surround the fuse, and a step of forming a side-face protecting film in the insulating film, which blocks the propagation of damages generated by the heat of melting of the fuse.

The step of forming a groove may be composed of a step of forming two grooves facing with each other having the fuse in between.

The step of forming a groove may be composed of a step of forming a single closed groove that surrounds the fuse.

The step of forming a groove may be composed of s step of forming a plurality of the grooves, and the step of forming the side-face protective film may be composed of a step of forming a side-face protective film in ach of the plurality of grooves formed.

The step of forming a lower protective film may be composed of a step of forming a plurality of the lower protective films.

BRIEF DESCRIPTION OF THE DRAWINGS

The above and other objects, features and advantages of the present invention will be more apparent from the following description taken in conjunction with the accompanying drawings, in which.

DESCRIPTION OF THE PREFERRED EMBODIMENTS

Figure 1A:
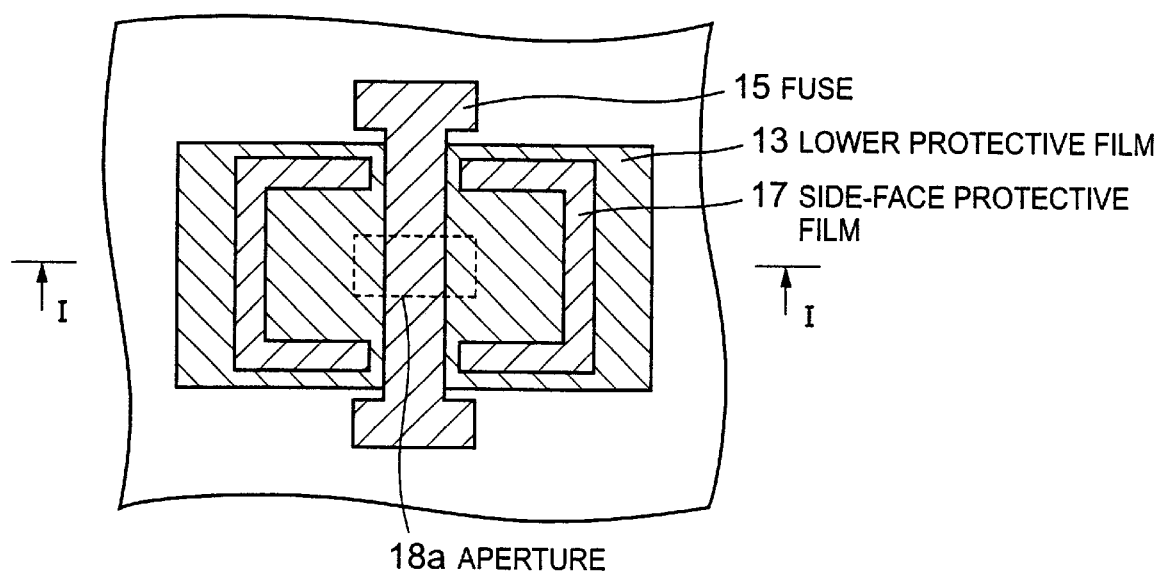
FIG. 1(*a*) is a plan view showing the configuration of the periphery of the fuse in a semiconductor device according to a first embodiment of this invention, and FIG. 1(*b*) is a sectional view along the line I—I in FIG. 1(*a*)

Next, referring to the drawings, a semiconductor device according to a first embodiment of this invention will be described.

Figure 1B:
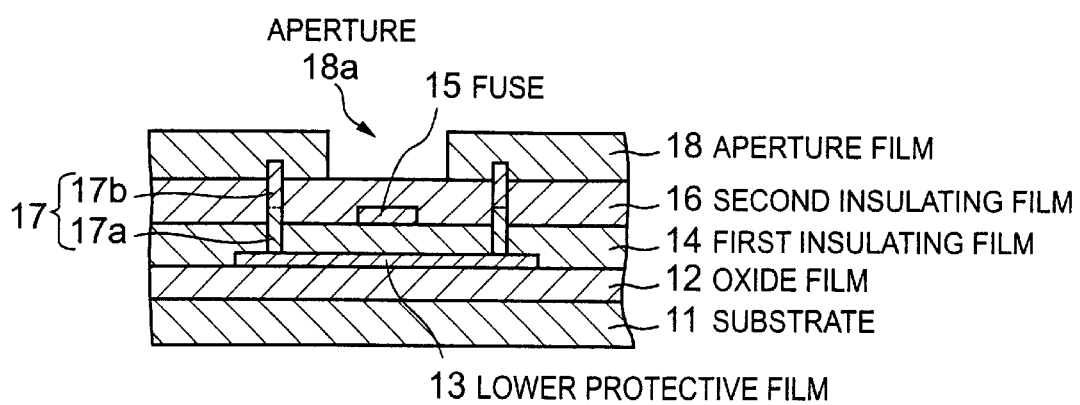

FIG. 1 illustrates diagrams showing the configuration of the periphery of the fuse according to the first embodiment, where FIG. 1(*a*) is a plan view of the periphery of the fuse, and FIG. 1(*b*) is a sectional view along the line I—I in FIG. 1(*a*).

As shown in FIG. 1, the fuse periphery of the semiconductor device is constituted of a substrate 11, an oxide film 12, a lower protective film 13, a first insulating film 14, a fuse 15, a second insulating film 16, a side-face protective film 17, and an aperture film 18.

The substrate 11 is a silicon substrate, for example, and an integrated circuit (IC) or the like, not shown, is formed on it.

The insulating film 12 is formed on the substrate 11, and isolates the wirings of the circuit formed on the substrate 11, and between the wirings of the substrate 11 and wirings on the upper layers. The material of the insulating film 12 is, for example, silicon dioxide.

The lower protective film 13 is formed in a prescribed region on the oxide film, and prevents the propagation of the damages (cracks or the like) generated at melting of the fuse into the substrate 11 or the oxide film 12 directly below the fuse 15. For this reason, the width of the lower protective film 13 is set about 10 $\mu$m, for example, wider than that of the fuse 15. The lower protective film 13 is formed of a material, such as polycrystalline silicon, which is less easy to generate cracks or the like due to the melting heat of the fuse 15 than the first insulating film 14 and the second insulating film 16.

The first insulating film 14 is made of, for example, silicon dioxide, and is formed on the oxide film 12 and the lower protective film 13 so as to cover the lower protective film 13. Moreover, in the first insulating film 14, there are formed two U-shaped contact holes (grooves) reaching the lower protective film 13 with a prescribed distance apart so as to surround a certain region.

The fuse 15 made of, for example, tungsten is formed in the region between the two contact holes on the first insulating film 14.

The second insulating film 16 made of, for example, silicon dioxide is formed on the first insulating film 14 and the fuse 15 so as to cover the fuse 15. Moreover, in the second insulating film 16, there are formed through holes (grooves) in the regions corresponding to the contact holes of the first insulating film 14.

The side-face protective film 17 is formed in the contact holes of the first insulating film 14 and the through holes of the second insulating film 16, and is composed of a lower side-face protective film 17*a* and an upper side-face protective film 17*b* as shown in FIG. 1(*b*). The side-face protective film 17 prevents the propagation of cracks or the like generated at melting of the fuse 15 due to laser beam into the adjacent regions of the fuse 15. The side-face protective film 17 is formed using a material which is less easy to develop cracks or the like by the melting heat of the fuse 15, than the first insulating film 14 and the second insulating film 16. For example, the material for the lower side-face protective film 17a may be tungsten, and the material for the upper side-face protective film 17b may be aluminum.

The aperture film 18 is made of, for example, silicon nitride and is formed on the second insulating film 16. In order to enhance the melting efficiency of the fuse 15 by the laser, the aperture film 18 has an opening 18a for laser irradiation in the region above the fuse 15.

As in the above, cracks or the like generated at melting of the fuse 15 are prevented from propagating into the peripheral regions of the fuse by means of the lower protective film 13 and the side-face protective film 17 formed to surround the fuse 15.

Next, a method of manufacture of the peripheral part of the fuse constituted as in the above will be described.

FIG. 2 illustrates sectional views showing the manufacturing steps of the peripheral part of the fuse.

Figure 2A:
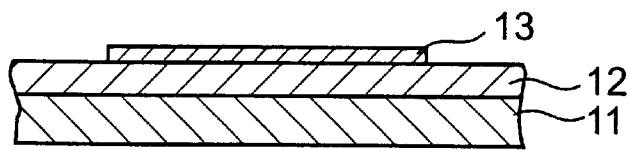
FIGS. 2.(*a*)–(*f*) show sectional views illustrating the manufacturing steps of the periphery of the fuse shown in FIG. 1.

First, an oxide film 12 is formed by chemical vapor deposition (CVD) or the like, as shown in FIG. 2(a), on the substrate 11 on which are formed integrated circuit and the like, not shown. Then a polycrystalline silicon film is formed on the oxide film 12 by CVD or the like. By patterning the polycrystalline silicon film by photolithography, etching, or the like, the lower protective film 13 is formed as shown in FIG. 2(a).

Figure 2B:
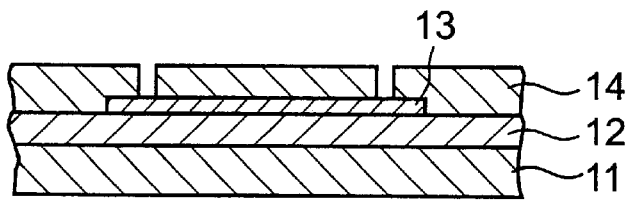

Next, the first insulating film 14 is formed by CVD or the like on the oxide film 12 and the lower protective film 13 so as to cover the lower protective film 13. Then, the contact holes for forming the side-face protective film 17 are formed by photolithography, etching or the like, as shown in FIG. 2(b).

Figure 2C:
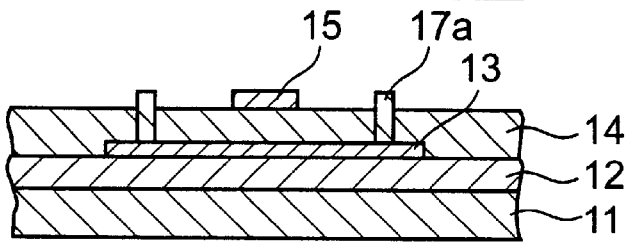

After the formation of the contact holes, a tungsten film is formed by CVD or the like on the surface of the contact holes formed in the first insulating film 14 and on the first insulating film 14. Then, the fuse 15 and the lower side-face protective film 17a are formed by patterning the tungsten film by photolithography, etching or the like as shown in FIG. 2(c). During the patterning, wirings or the like (not shown) may be formed simultaneously on the first insulating film 14.

Figure 2D:
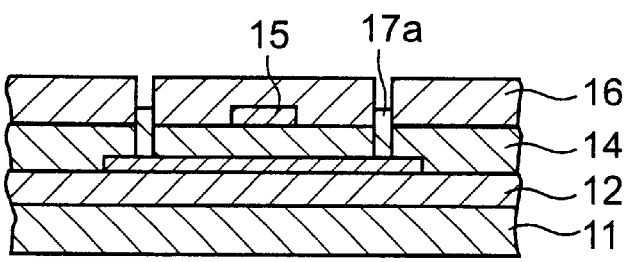

Then, a second insulating film 16 is formed by CVD or the like on the first insulating film 14 so as to cover the fuse 15 or the like. Following that, through holes are formed in the portions corresponding to the lower side-face protective film 17a by photolithography, etching or the like as shown in FIG. 2(d).

Figure 2E:
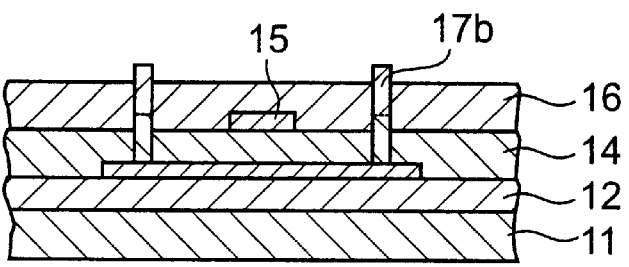

After the formation of the through holes, an aluminum film is formed by CVD or the like on the surface of the through holes of the second insulating film 16 and on the second insulating film 16. Then, the upper side-face protective film 17b is formed by patterning the aluminum film using photolithography, etching or the like, as shown in FIG. 2(e).

Figure 2F:
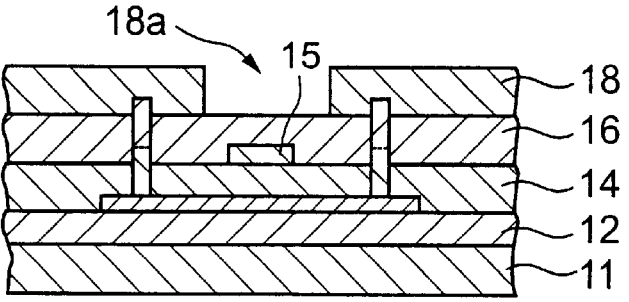

After the formation of the upper side-face protective film 17b, the aperture film 18 is formed by CVD or the like on the second insulating film 16. Then, the opening 18a for laser irradiation is formed by photolithography, etching or the like as shown in FIG. 2(f), completing the fuse peripheral part as shown in FIG. 1.

As in the above, it is possible to form the lower protective film 13 at directly below the fuse 15, and form the side-face protective film 17 so as to surround the periphery of the fuse 15. In this way, the propagation of the cracks or the like generated at melting of the fuse 15 into the periphery of the fuse can be prevented. Moreover, since the side-face protective film 17 is formed to be connected to the lower protective film 13, it is possible to block the propagation of the cracks or the like into the periphery of the fuse through the gap between the side face protective film 17 and the lower protective film 13. Furthermore, the diffusion of the moisture infiltrating through the opening 18a by way of the cracks or the like can be blocked by the lower protective film 13 and the side-face protective film 17. Accordingly, it is possible to form circuits and wirings in the region directly below and in the periphery of the fuse 15, thereby enhancing the circuit integration degree and the operational reliability of the semiconductor device.

Next, referring to the drawings, a semiconductor device according to a second embodiment of the invention will be described.

Figure 3A:
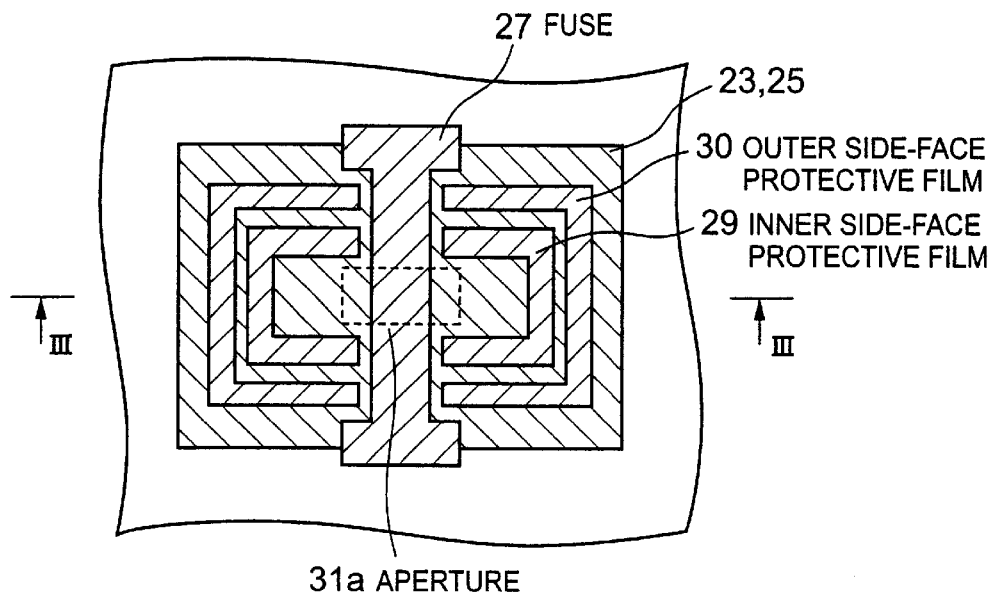
FIG. 3(*a*) is a plan view showing the configuration of the periphery of the fuse in a semiconductor device according to a second embodiment of this invention, and FIG. 3(*b*) is a sectional view along the line III—III in FIG. 3(*a*)
Figure 3B:
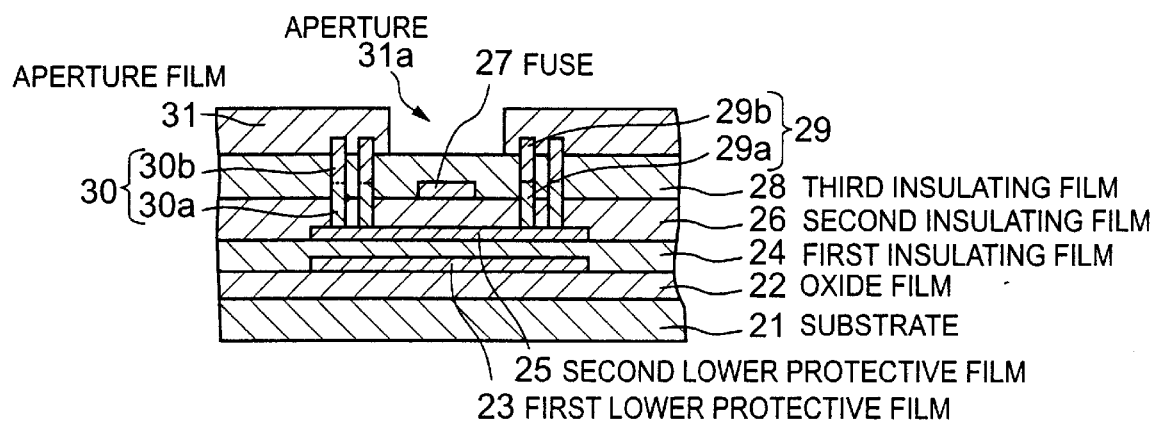

FIG. 3 gives diagrams showing the configuration of the periphery of the fuse of a semiconductor device according to the second embodiment of the invention, in which FIG. 3(a) is a plan view of the fuse peripheral part, and FIG. 3(b) is a sectional view along the line III—III in FIG. 3(a).

The fuse periphery of the semiconductor device according to the second embodiment of the invention is formed, as shown in FIG. 3, to have a double construction for the lower protective film 13 and the side-face protective film 17 of the fuse peripheral part shown in the first embodiment. More specifically, the fuse peripheral part of this embodiment is composed of a substrate 21, an oxide film 22, a first lower protective film 23, a first insulating film 24, a second lower protective film 25, a second insulating film 26, a fuse 27, a third insulating film 28, an inner side-face protective film 29, an outer side-face protective film 30, and an aperture film 31.

The substrate 21 is made of, for example, silicon and an integrated circuit (IC), not shown, and the like are formed on it.

The oxide film 22 is made of, for example, silicon dioxide and is formed on the substrate 21 for isolating the wirings of the circuits formed on the substrate 21, and the wirings of the substrate 21 from the upper wirings.

The first lower protective film 23 formed in a prescribed region of the oxide film 22 is for preventing the propagation of the damages (cracks or the like) generated at melting of the fuse 27 by the laser into the regions of the substrate 21 and the oxide film 22 directly below the fuse 27. For this purposes the width of the first lower protective film 23 is set wider by about 10 m than that of the fuse 27. The first lower protective film 23 is formed using a material such as polycrystalline silicon which is less easy to develop cracks by the melting heat of the fuse 27 than the first insulating film 24, the second insulating film 25 and the third insulating film 28.

The first insulating film 24 is made of, for example, silicon dioxide and is formed on the oxide film 22 and the first lower protective film 23 so as to cover the first lower protective film 23.

The second lower protective film 25 is formed on the first insulating film 24 so as to correspond to the first lower protective film 23. Moreover, the second lower protective film 25 prevents, together with the first lower protective film 23, the propagation of the cracks or the like generated at melting of the fuse 25 by the laser, into the regions of the substrate 21 and the oxide film 22 directly below the fuse 27. Furthermore, the second lower protective film 25 is formed of, for example, polycrystalline silicon which is less easy to develop cracks by the melting heat of the fuse 27 than the second insulating film 26 and the third insulating film 28.

The second insulating film 26 is made of, for example, silicon dioxide, and is formed on the first insulating film 24 and the second lower protective film 25 so as to cover the second lower protective film 25. Moreover, two pairs of U-shaped contact holes reaching the second lower protective film 25 are formed in the second insulating film 26.

More specifically, a pair of contact holes is formed so as to surround the region where the fuse 27 is located, and the other pair is formed so as to surround these contact holes.

The fuse 27 is made of, for example, tungsten, and is formed in the region between the paired two contact holes.

The third insulating film 28 is made of, for example, silicon dioxide and is formed on the second insulating film 26 and the fuse 27 so as to cover the fuse 27. Moreover, through holes are formed in the third insulating film 28 in the regions corresponding to the contact holes of the second insulating film 26.

The inner side-face protective film 29 is formed, as shown in FIG. 3, in the inner holes out of the contact holes formed in the second insulating film 26 and the through holes formed in the third insulating film 28. The inner side-face protective film 29 prevents the propagation of the cracks or the like generated at melting of the fuse 27 by the laser into the regions adjacent to the fuse 27. The inner side-face protective film 29 consists of a lower side-face protective film 29a and an upper side-face protective film 29b. Moreover, the inner side-face protective film 29 is formed of a material which is less easy to generate cracks or the like due to the melting heat of the laser than the second insulating film 26 and the third insulating film 28. For example, the material for the lower side-face protective film 29a may be tungsten and the material for the upper side-face protective film 29b may be aluminum.

The outer side-face protective film 30 is formed, as shown in FIG. 3, in the outer holes out of the contact holes formed in the second insulating film 26 and the through holes formed in the third insulating film 28. The outer side-face protective film 30 prevents, together with the inner side-face protective film 29, the propagation of the cracks or the like generated at melting of the fuse 27 by the laser into the regions adjacent to the fuse 27. The outer side-face protective film 30 is composed of a lower side-face protective film 30a and an upper side-face protective film 30b, and is formed of a material which is less easy to develop cracks or the like due to the melting heat of the fuse 27 by the laser than the second insulating film 26 and the third insulating film 28. For example, the material for the lower side-face protective film 30a may be tungsten, and the material for the upper side-face protective film 30b may be aluminum.

The aperture film 31 is made of, for example, silicon nitride, and is formed on the third insulating film 28. Moreover, the aperture film 31 has an opening 31a for laser irradiation in the upper part of the fuse 27 in order to enhance the melting efficiency of the fuse 27 by the laser.

Since double protective film (the first lower protective film 23, the second lower protective film 25, the inner side-face protective film 29 and the outer side-face protective film 30) is formed so as to surround the fuse 27, as described in the above, it is possible to prevent the propagation of the cracks or the like generated at melting of the fuse 27 more surely than in the first embodiment.

Next, the method of manufacturing the fuse peripheral part constituted as in the above will be described.

FIG. 4 illustrates sectional views showing various manufacturing steps of the fuse peripheral part.

Figure 4A:
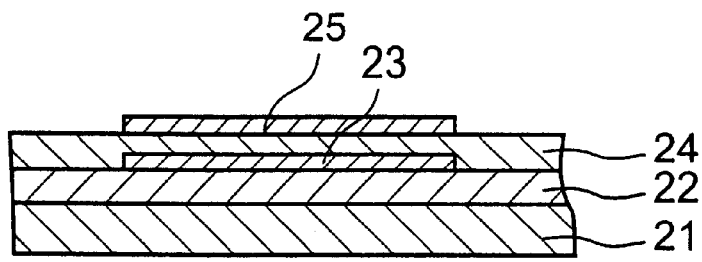
FIGS. 4(*a*)–(*e*) show sectional views illustrating the manufacturing steps of the periphery of the fuse shown in FIG. 3.

First, the oxide film 22 is formed by CVD or the like, as shown in FIG. 4(a), on the substrate 21 on which are formed an integrated circuit and the like, not shown. After that, a polycrystalline silicon film is formed on the oxide film 22 by CVD or the like. Then, the first lower protective film 23 is formed by photolithography, etching or the like by patterning the polycrystalline silicon film, as shown in FIG. 4(a).

Next, the first insulating film 24 is formed by CVD or the like on the oxide film 22 and the first lower protective film 23 so as to cover the first lower protective film 23, as shown in FIG. 4(a). Then, a tungsten film is formed on the first insulating film 24 by CVD or the like. After that, the second lower protective film 25 is formed by photolithography, etching or the like by patterning the tungsten film, as shown in FIG. 4(a).

Figure 4B:
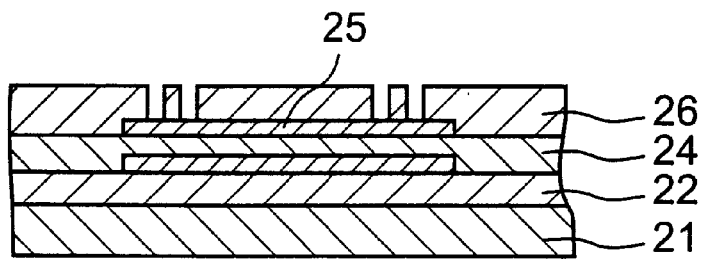

After the formation of the second lower protective film 25, the second insulating film 26 is formed on the first insulating film 24 and the second lower protective film 25 by CVD or the like so as to cover the second lower protective film 25. Then, contact holes for forming the inner side-face protective film 29 and the outer side-face protective film 30 are formed by photolithography, etching or the like, as shown in FIG. 4(b).

Figure 4C:
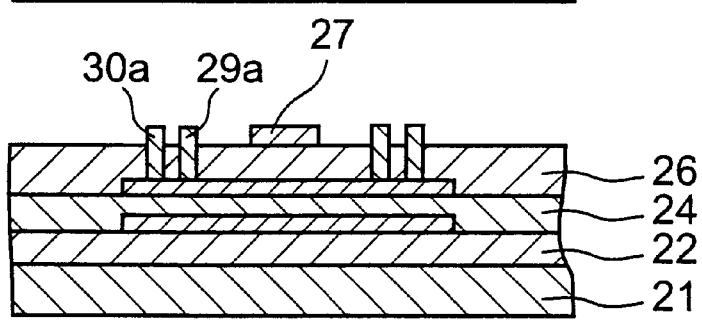

After the formation of the contact holes, a tungsten film is formed on the surface of the contact holes of the second insulating film 26 and on the second insulating film 26 by CVD or the like. Then, the fuse 27, the lower side-face protective films 29a and 30a are formed by photolithography, etching or the like by patterning the tungsten film, as shown in FIG. 4(c). During the patterning, wirings or the like (not shown) may be formed simultaneously on the second insulating film 26.

Figure 4D:
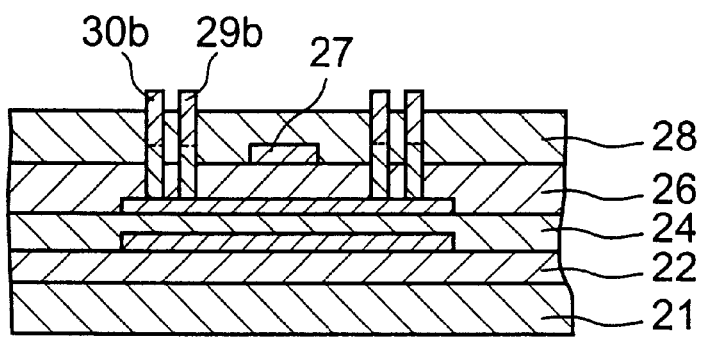

Then, the third insulating film 28 is formed by CVD or the like on the second insulating film 26 so as to cover the fuse 27 and the like. Next, the through holes are formed in the regions corresponding to the lower side-face protective films 29a and 30a by photolithography, etching or the like. Following that, an aluminum film is formed by CVD or the like on the surface of the through holes of the third insulating film 28 and on the third insulating film 28. Then, the upper side-face protective films 29b and 30b are formed by photolithography, etching or the like by patterning the aluminum film as shown in FIG. 4(d)

Figure 4E:
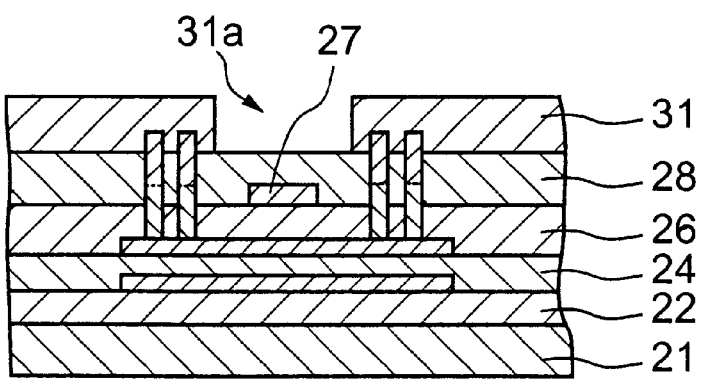
Figure 5A:
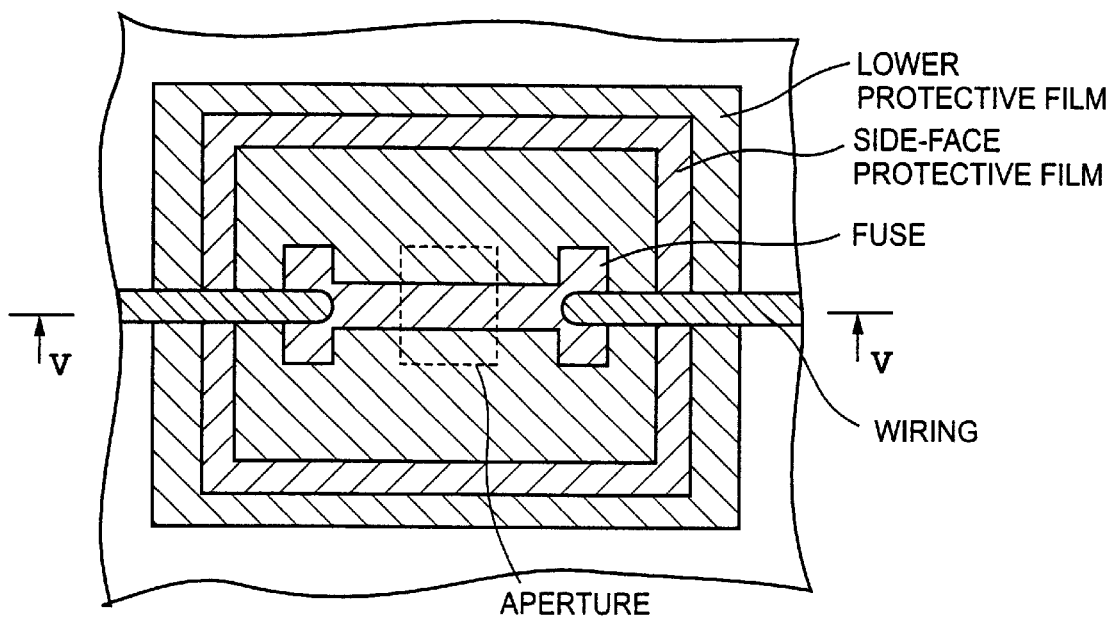
FIG. 5(*a*) is a plan view of the periphery of the fuse in a semiconductor device according to another embodiment of this invention, and FIG. 5(*b*) is a sectional view along the line V—V in FIG. 5(*a*)
Figure 5B:
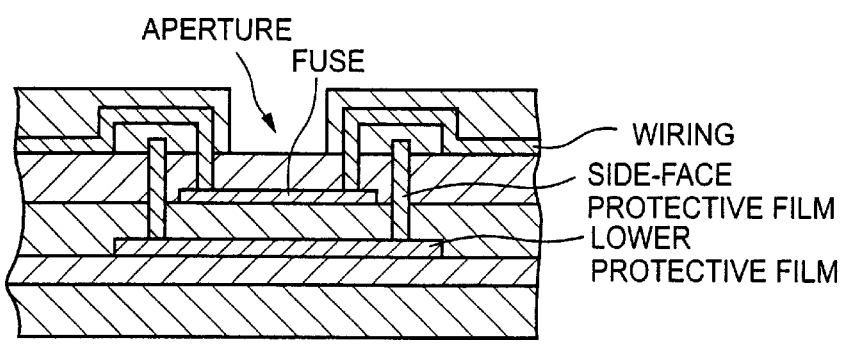
Figure 6A:
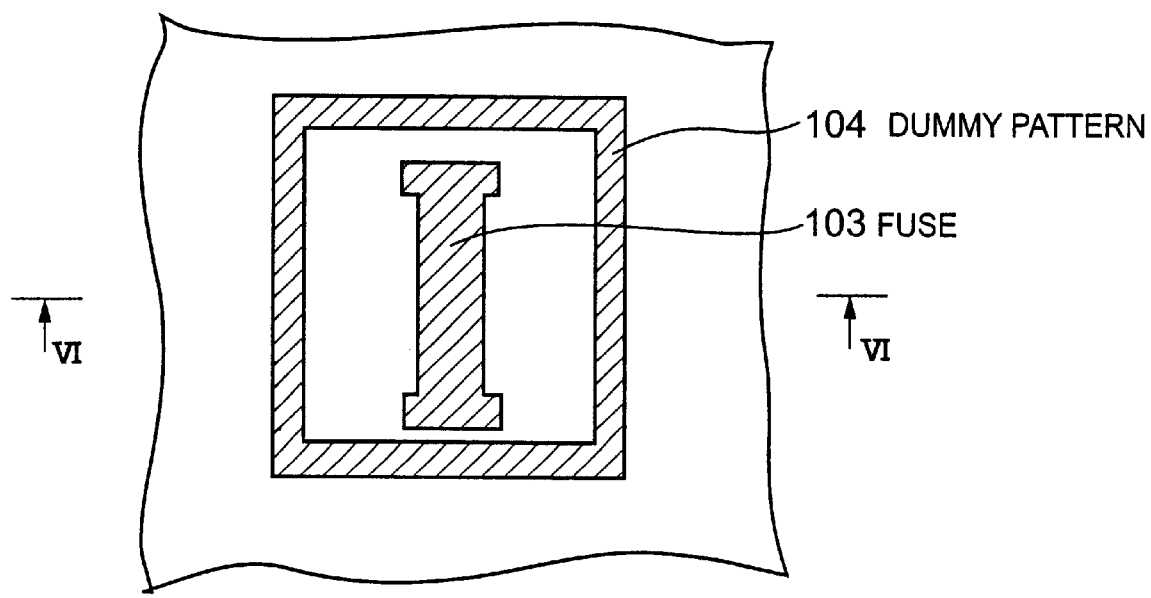
FIGS. 6(*a*), (*b*) are a plan view and a sectional view along the line VI—VI showing the configuration of a conventional fuse periphery.
Figure 6B:
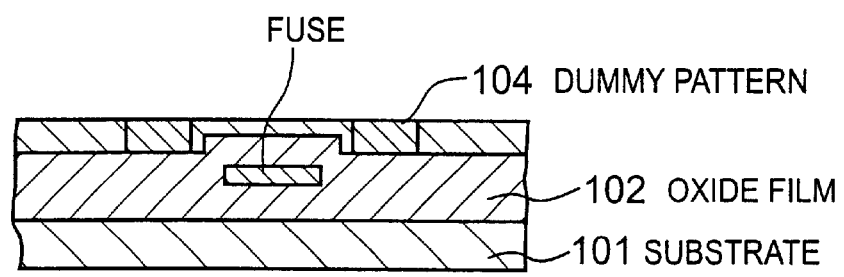

After the formation of the upper side-face protective films 29b and 30b, the aperture film 31 is formed on the third insulating film 28 by CVD or the like. Then, an opening 31(a) for laser irradiation is formed by photolithography, etching or the like as shown in FIG. 4(e), completing the fuse peripheral part as shown in FIG. 3.

As in the above, a double protective film can be formed at directly below the fuse 27 and it side-faces so as to surround the fuse 27, by which it is possible to prevent a large damage that cannot be prevented by a single protective film. Analogous to the first embodiment, the diffusion of moisture infiltrating through cracks or the like generated via the opening 31a can be blocked by the double protective film. Accordingly, circuits, wirings and the like can be formed in the regions directly below and in the periphery of the fuse, and it is possible to enhance the degree of circuit integration and the operational reliability of the semiconductor devices.

The side-face protective films shown in the first and the second embodiments may be formed in such a way that they penetrate from the lower protective film to the surface of the aperture film. With this arrangement, it is possible to prevent the propagation of the damages generated at melting of the fuse by the laser, into the fuse peripheral part by going over the side-face protective films.

Moreover, the side-face protective film of the first and the second embodiments may be formed so as to surround the fuse completely. In this case, the wirings or the like connected to the fuse are formed straddling the side-face protective films. By so doing, it is possible to prevent the propagation of the damages generated at melting of the fuse, through the gap in the side-face protective films, into the fuse peripheral regions.

Furthermore, the side-face protective film of the first and the second embodiments may be formed as a single layer instead of the two layers of the lower side-face protective film and the upper side-face protective film. In this case, a contact hole reaching the lower protective film is formed after the formation of the insulating film covering the fuse, and the side-face protective film is formed in the contact hole. For example, in the configuration of the first embodiment, the fuse 15 is formed on the first insulating film 14, and the second insulating film 16 is formed so as to cover the fuse 15. After that, a contact hole is formed in the first insulating film 14 and the second insulating film 16. Then, the side-face protective film 17 is formed within the contact hole of the first insulating film 14 and the second insulating film 16. With this arrangement, there appears no joint between the lower and the upper parts in the side- face protective film 17, and hence can more surely prevent damages generated at melting of the fuse.

Moreover, when the lower protective film is an electrical insulator, the fuse may be formed to make contact with the lower protective film. By so doing, since there is no insulating film or the like between the fuse and the lower protective film, it is possible to restrict the generating region of the damages due to melting of the fuse to the region above the plane of formation of the fuse.

Moreover, the areas of the first lower protective film 23 and the second lower protective film 25 shown in the second embodiment may not be the same. For example, the area of the first lower protective film 23 may be larger than the area of the second lower protective film 25.

Moreover, three or more lower protective films and side-face protective films may be formed as needed, and the number of layers of the lower protective films and the side-face protective films may be different.

Moreover, the side-face protective film shown in the first and second embodiments may be semicircular rather than U-shaped provided that it can be so formed by photolithography, etching or the like.

Moreover, the lower protective films 13, 23 and 25, and the side-face protective films 17, 29 and 30 may be formed of materials other than those mentioned above, provided that it is possible to prevent damages at melting of the-fuse. The lower insulating films 13, 23 and 25 may be formed of an insulating film (silicon nitride, for example) or a metal (aluminum, for example). Moreover, the lower side-face protective film of the side-face protective films 17, 29 and 30 may be formed of a metal (aluminum, for example) other than that in the above or a semiconductor material (polycrystalline silicon, for example), and the upper side-face protective film may be formed of a metal (tungsten for example) other than that in the above or a semiconductor material (polycrystalline silicon, for example). Furthermore, the side-face protective films 17, 29 and 30 may be formed of the same material for the upper and lower parts.

As is clear from the above description, this invention makes it possible to prevent the propagation of the damages generated by the heat of melting of the fuse into the peripheral part of the fuse. Moreover, since the side-face protective film is formed in a groove which reaches the lower protective film, no gap is formed between the side-face protective film and the lower protective film. With this arrangement, it is possible to prevent the propagation of the damages generated at melting of the fuse into the fuse peripheral regions through the gap between the side-face protective film and the lower protective film. Accordingly, circuits, wirings or the like can be formed in the regions directly below and in the periphery, of the fuse and it is possible to enhance the circuit integration degree and the operational reliability of the semiconductor device.

What is claimed is:

1. A semiconductor device equipped with a fuse for isolating a circuit from the other circuits, the semiconductor device comprising:

a lower protective film having a width larger than that of the fuse and formed in a prescribed region of a substrate for blocking the propagation of damages caused by heat generated at melting of the fuse;

a fuse formed on said lower protective film;

an insulating film formed on said lower protective film so as to cover said fuse, having a groove formed to reach the lower protective film and to surround the fuse; and a side-face protective film formed in the groove of said insulating film and surrounding the fuse to block the propagation of the damages generated by the heat of melting of the fuse into a periphery of the fuse.

2. The semiconductor device as claimed in claim 1, wherein said groove formed so as to surround said fuse is composed of two grooves facing with each other having said fuse in between, and said side-face protective film is formed in said two grooves.

3. The semiconductor device as claimed in claim 1, wherein said groove is a single closed groove surrounding said fuse, and said side-face protective film is formed within said single closed groove.

4. The semiconductor device as claimed in claim 1, wherein said side-face protective film is composed of a lower side-face protective film and an upper side-face protective film formed on said lower side-face protective film, and said lower side-face protective film is formed of a material the same as that of said fuse.

5. The semiconductor device as claimed in claim 4, wherein said lower side-face protective film is formed so as to have its connection surface with said upper side-face protective film to be located on substantially the same plane as the surface of said fuse.

6. The semiconductor device as claimed claim 1, wherein said side-face protective film is formed of a material which is less easy to generate cracks due to heat of melting of the fuse than said insulating film.

7. The semiconductor device as claimed in claim 1, wherein a plurality of said side-face protective films are formed.

8. The semiconductor device as claimed in claim 1, wherein said lower protective film is formed of a material which is less easy to generate cracks due to heat of melting of the fuse than said insulating film.

9. The semiconductor device as claimed in claim 1, wherein a plurality of said lower protective films are formed.

10. A method of manufacturing a semiconductor device equipped with a fuse for isolating a circuit from the other circuits, the method of manufacturing a semiconductor device comprising:

forming a lower protective film having a width larger than that of the fuse, formed in a prescribed region of a substrate, for blocking the propagation of damages caused by heat generated at melting of the fuse;

forming a fuse on said lower protective film;

forming an insulating film on said lower protective film so as to cover said fuse;

forming a groove in said insulating film so as to reach said lower protective film in a manner to surround said fuse; and forming in said groove a side-face protective film which surrounds said fuse and blocks the propagation of damages generated by the fuse melting heat into a periphery of said fuse.

11. The method of manufacturing a semiconductor device as claimed in claim 10, wherein said step of forming a groove is provided with a step of forming two grooves facing with each other having said fuse in between.

12. The method of manufacturing a semiconductor device as claimed in claim 10, wherein said step of forming a groove is provided with a step of forming a single closed loop surrounding said fuse.

13. The method of manufacturing a semiconductor device as claimed in claim 10, wherein said step of forming a groove is provided with a step of forming a plurality of said grooves, and said step of forming a side-face protective film is provided with a step of forming a side-face protective film in said plurality of formed grooves.

14. The method of manufacturing a semiconductor device as claimed in claim 10, wherein said step of forming a lower protective film is provided with a step of forming a plurality of said lower protective films.

15. A semiconductor device comprising:

a lower protective film selectively formed on a semiconductor substrate;

a first insulating film formed on said lower protective film and a semiconductor substrate;

a fuse formed on a part of said first insulating film over said lower protective film; and a side-face protective film formed on said lower protective film so as to substantially surround said fuse and substantially partition said first insulating film into inner area including said fuse and outer area excluding said fuse and block the propagation of damages generated by the heat of melting of the fuse into said outer area.

16. The semiconductor device as claimed in claim 15, further comprising:

a second insulating film formed on said first insulating film and covering said fuse; and wherein said side-face protective film substantially partitions said second insulating film into inner area including said fuse and outer area excluding said fuse.

17. The semiconductor device as claimed in claim 15, wherein said lower protective film comprises a polycrystalline silicon film.

18. The semiconductor device as claimed in claim 15, wherein said side-face protective film comprises a metal film.

19. The semiconductor device as claimed in claim 15, wherein said side-face protective film comprises a tungsten film.

* * * * *